United States Patent
Ikeda

(10) Patent No.: US 9,337,402 B2
(45) Date of Patent: May 10, 2016

(54) METHOD FOR MANUFACTURING SEMICONDUCTOR LIGHT EMITTING DEVICE

(71) Applicant: NICHIA CORPORATION, Anan-shi (JP)

(72) Inventor: Tadaaki Ikeda, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/548,102

(22) Filed: Nov. 19, 2014

(65) Prior Publication Data

US 2015/0140702 A1    May 21, 2015

(30) Foreign Application Priority Data

Nov. 21, 2013   (JP) .................................. 2013-240553

(51) Int. Cl.
*H01L 21/00* (2006.01)
*H01L 33/56* (2010.01)
*H01L 33/00* (2010.01)
*H01L 33/54* (2010.01)

(52) U.S. Cl.
CPC ............ *H01L 33/56* (2013.01); *H01L 33/0079* (2013.01); *H01L 33/54* (2013.01); *H01L 2224/13* (2013.01); *H01L 2924/10157* (2013.01); *H01L 2933/0033* (2013.01)

(58) Field of Classification Search
CPC ..................... H01L 21/7806; H01L 21/7813
See application file for complete search history.

(56) References Cited

U.S. PATENT DOCUMENTS

2011/0309327 A1 * 12/2011 Jeong ............................... 257/13
2013/0285091 A1    10/2013 Akimoto et al.
2013/0313589 A1    11/2013 Tomizawa et al.

FOREIGN PATENT DOCUMENTS

| JP | 3589187 B2 | 8/2004 |
| JP | 2013-042191 A | 2/2013 |
| JP | 2013-232539 A | 11/2013 |
| JP | 2014-003283 A | 1/2014 |

* cited by examiner

*Primary Examiner* — Reema Patel
(74) *Attorney, Agent, or Firm* — Foley & Lardner LLP

(57) ABSTRACT

The method for manufacturing the semiconductor light emitting device includes steps of forming a plurality of semiconductor light emitting element regions on a substrate, forming a recess portion between the plurality of semiconductor light emitting element regions on a surface of the substrate, disposing a light reflective sealing resin on the substrate to cover the plurality of semiconductor light emitting element regions with the sealing resin and to fill the recess portion with a part of the sealing resin that covers the plurality of semiconductor light emitting element regions, removing the substrate, disposing a light transmissive resin on surfaces of the plurality of semiconductor light emitting element regions where the substrate has been removed, and dividing the plurality of semiconductor light emitting element regions into individual pieces, wherein the recess portion includes a first recess portion and one or more second recess portions shallower than the first recess portion.

20 Claims, 7 Drawing Sheets

METHOD FOR MANUFACTURING SEMICONDUCTOR LIGHT EMITTING DEVICE

CROSS-REFERENCE TO RELATED PATENT APPLICATIONS

This application claims priority to Japanese Application No. 2013-240553, filed Nov. 21, 2013 the disclosures of which are hereby incorporated by reference in its entirety.

BACKGROUND

1. Field

The disclosure relates to a method for manufacturing a semiconductor light emitting device.

2. Description of Related Art

Conventionally, there has been proposed a semiconductor light emitting device manufactured in such a manner that a semiconductor layer is formed on a substrate, the substrate is thereafter removed by laser lift-off, and a light transmissive resin is formed on the top surface of the semiconductor layer which is left after the removal of the substrate (see JP 2013-42191 A).

However, in the above conventional semiconductor light emitting device, light emitted from the semiconductor layer disadvantageously leaks from the side surface of the light transmissive resin, and it is therefore not possible to efficiently extract light toward the front side of the semiconductor light emitting device.

SUMMARY OF THE INVENTION

In view of the above, an object of the present invention is to provide a method for manufacturing a semiconductor light emitting device that is capable of suppressing leakage of light from the side surface of a light transmissive resin disposed on the top surface of a semiconductor light emitting element region.

According to one embodiment of the present invention, the above problem is solved by the following means. Specifically, a method for manufacturing a semiconductor light emitting device includes steps of forming a plurality of semiconductor light emitting element regions on a substrate, forming a recess portion between the plurality of semiconductor light emitting element regions on a surface of the substrate, disposing a light reflective sealing resin on the substrate to cover the plurality of semiconductor light emitting element regions with the sealing resin and to fill the recess portion with a part of the sealing resin that covers the plurality of semiconductor light emitting element regions, removing the substrate, disposing a light transmissive resin on surfaces of the plurality of semiconductor light emitting element regions where the substrate has been removed, and dividing the plurality of semiconductor light emitting element regions into individual pieces, wherein the recess portion includes a first recess portion and one or more second recess portions shallower than the first recess portion.

The embodiment of the present invention makes it possible to efficiently extract light from the top surface of the semiconductor light emitting device. Further, the embodiment of the present invention makes it possible to manufacture such a semiconductor light emitting device in a relatively small number of steps.

BRIEF DESCRIPTION OF THE DRAWINGS

FIGS. 3A to 3C are schematic diagrams of a semiconductor light emitting device according to a first example of the present invention, wherein FIG. 3A is a schematic top view; FIG. 3B is a schematic cross-sectional view taken along line A-A of FIG. 3A; and FIG. 3C is a schematic bottom view.

FIGS. 4A to 4C are schematic diagrams of a semiconductor light emitting device according to a second example of the present invention, wherein FIG. 4A is a schematic top view of; FIG. 4B is a schematic cross-sectional view taken along line A-A of FIG. 4A; and FIG. 4C is a schematic bottom view.

FIGS. 5A to 5C are schematic diagrams of a semiconductor light emitting device according to a third example of the present invention, wherein FIG. 5A is a schematic top view; FIG. 5B is a schematic cross-sectional view taken along line A-A of FIG. 5A; and FIG. 5C is a schematic bottom view.

DETAILED DESCRIPTION

Figure 1A:
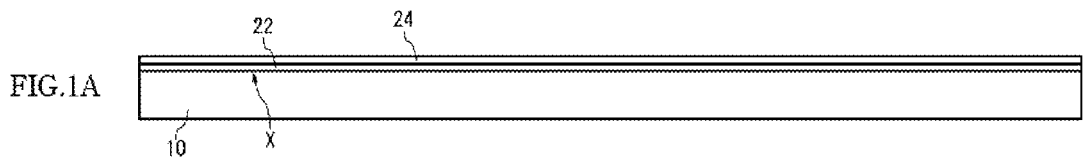
FIGS. 1A to 1L are schematic diagrams showing a method for manufacturing a semiconductor light emitting device according to a first embodiment of the present invention.

Hereinafter, embodiments of the present invention will be described with reference to the accompanying drawings.

[Method for Manufacturing Semiconductor Light Emitting Device According to First Embodiment]

FIGS. 1A to 1L are schematic diagrams showing a method for manufacturing a semiconductor light emitting device according to a first embodiment.

As shown in FIGS. 1A to 1L, the method for manufacturing the semiconductor light emitting device according to the first embodiment includes a step of forming a plurality of semiconductor light emitting element regions 20 on a substrate 10 (first step), a step of forming a recess portion 12 between the plurality of semiconductor light emitting element regions 20 on a surface of the substrate 10 (second step), a step of disposing a light reflective sealing resin 50 on the substrate 10 to cover the plurality of semiconductor light emitting element regions 20 with the sealing resin 50 and to fill the recess portion 12 with a part of the sealing resin 50 that covers the plurality of semiconductor light emitting element regions 20 (third step), a step of removing the substrate 10 (fourth step), a step of disposing a light transmissive resin 60 on surfaces of the plurality of semiconductor light emitting element regions 20 where the substrate 10 has been removed (fifth step), and a step of dividing the plurality of semiconductor light emitting element regions 20 into individual pieces (sixth step). In the second step, the recess portion 12 includes a first recess portion 14a and one or more second recess portions 14b shallower than the first recess portion 14a. In the first embodiment, there is described an example in which the recess portion 12 has a step difference as a whole by forming the second recess portion 14b in contact with the first recess portion 14a (for example, by forming the first recess portion 14a inside the second recess portion 14b or by forming the second recess portions 14b in contact with both sides of the first recess portion 14a). However, the form of the recess portion 12 is not limited thereto.

Hereinafter, the steps will be sequentially described.

(First Step)

First, the plurality of semiconductor light emitting element regions 20 are formed on the substrate 10.

For example, as shown in FIG. 1A, a first semiconductor layer 22 is first formed on the substrate 10 and a second semiconductor layer 24 is formed on the first semiconductor layer 22. The second semiconductor layer 24 has an active layer. Light emitted from the active layer of the second semiconductor layer 24 is extracted from a surface of the first semiconductor layer 22, the surface facing the substrate 10 (top surfaces X of the semiconductor light emitting element regions 20).

Figure 1B:
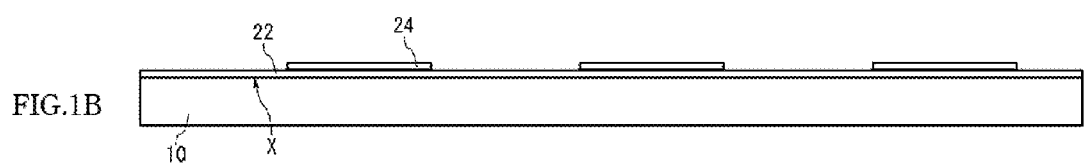

Then, as shown in FIG. 1B, the second semiconductor layer 24 is patterned using a resist mask or the like to thereby remove a part of the second semiconductor layer 24 formed on the first semiconductor layer 22.

Figure 1C:
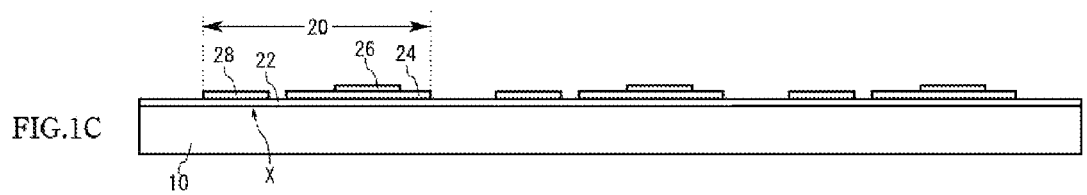

Then, as shown in FIG. 1C, a p-side electrode 26 is formed on the second semiconductor layer 24, and an n-side electrode 28 is formed on a part of the first semiconductor layer 22 where the second semiconductor layer 24 does not exists.

(Second Step)

Then, the first recess portion 14a and the second recess portion 14b are formed between the plurality of semiconductor light emitting element regions 20 on the surface of the substrate 10.

Figure 1D:
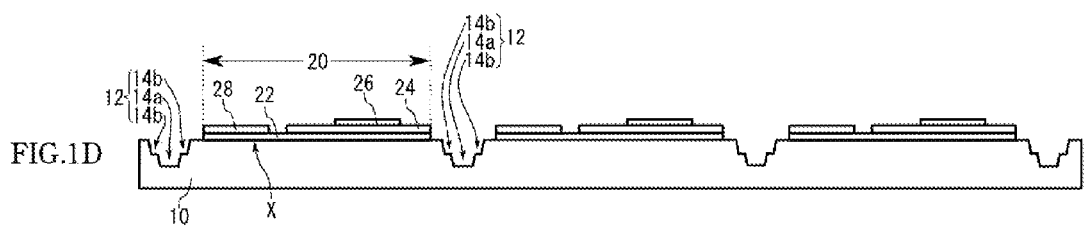

For example, as shown in FIG. 1D, the first semiconductor layer 22 is removed in a region where the second semiconductor layer 24 provided on the first semiconductor layer 22 has been removed by reactive ion etching (RIE) method using a mask or a laser ablation method. Then, the first recess portion 14a and the second recess portion 14b are formed on the surface of the substrate 10 in a region where the first semiconductor layer 22 has been removed by laser processing or dicing blade. The removal of the first semiconductor layer 22 and the formation of the first recess portion 14a and the second recess portion 14b may be individually performed using different processing methods as described above (that is, in two steps), or may also be collectively performed using the same processing method (that is, in a single step). Further, the removal of the first semiconductor layer 22 and the formation of either one of the first recess portion 14a and the second recess portion 14b (formation of a part of the step difference of the recess portion 12) may be collectively performed using the same processing method, and the formation of the other one of the first recess portion 14a and the second recess portion 14b (formation of the rest part of the step difference of the recess portions 12) may be performed using a processing method that differs from the above one.

The shapes of the first recess portion 14a and the second recess portion 14b are not particularly limited. However, when the first recess portion 14a and the second recess portion 14b are formed by dicing, the first recess portion 14a and the second recess portion 14b are formed into an inverted trapezoidal shape (an example of a shape tapered from the opening to the bottom). Therefore, it is possible to suppress the sealing resin 50 filled in the first recess portion 14a and the second recess portion 14b from peeling off together with the substrate 10 in the step of removing the substrate 10 (the fourth step described below). Further, because the side surfaces of the first recess portion 14a and the second recess portion 14b are formed into a tapered shape, the light transmissive resin 60 can be formed into an inverted tapered shape. The side surfaces of the first recess portion 14a and the second recess portion 14b may have no step difference or irregularity, or may also have step differences or irregularities. The side surfaces of the first recess portion 14a and the second recess portion 14b may be formed into flat surfaces, or may also be formed into curved surfaces.

The first recess portion 14a and the second recess portion 14b (a first recess portion 16a in a second embodiment) are each preferably formed into a continuous lattice shape in plan view of the entire wafer. In this case, a single semiconductor light emitting element region 20 is surrounded by the first recess portion 14a and the second recess portion 14b (the first recess portion 16a in the second embodiment) in a continuous linear shape.

(Third Step)

Then, the light reflective sealing resin 50 is disposed on the substrate 10 to cover the plurality of semiconductor light emitting element regions 20 with the sealing resin 50 and to fill the first recess portion 14a and the second recess portion 14b with a part of the sealing resin 50 which covers the plurality of semiconductor light emitting element regions 20.

Figure 1E:
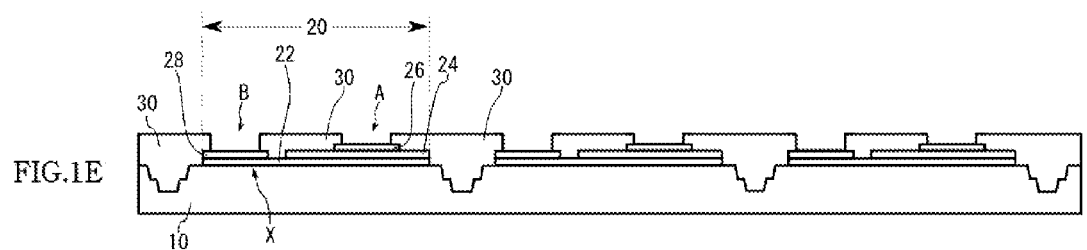

For example, as shown in FIG. 1E, an insulating film 30 is formed between the end of the p-side electrode 26 and the end of the n-side electrode 28 so as to cover the p-side electrode 26 and the n-side electrode 28. The insulating film 30 is disposed on also the surface of the substrate 10 in the region where the first semiconductor layer 22 has been removed and the inside of the first recess portion 14a and the second recess portion 14b formed on the substrate 10. An opening A which reaches the p-side electrode 26 and an opening B which reaches the n-side electrode 28 are formed on the surface of the insulating film 30. As the insulating film 30, for example, an organic material such as photosensitive resist can be used.

Figure 1F:
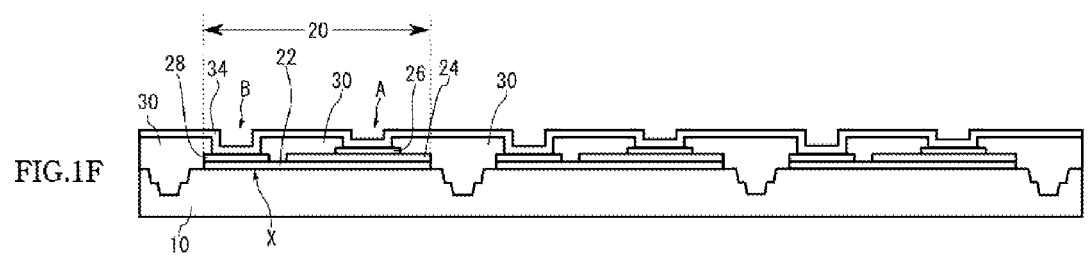

Then, as shown in FIG. 1F, a seed metal 34 is formed on the whole area of an exposed part such as the upper surface of the insulating film 30 and inner walls of the openings A, B formed on the surface of the insulating film 30.

Figure 1G:
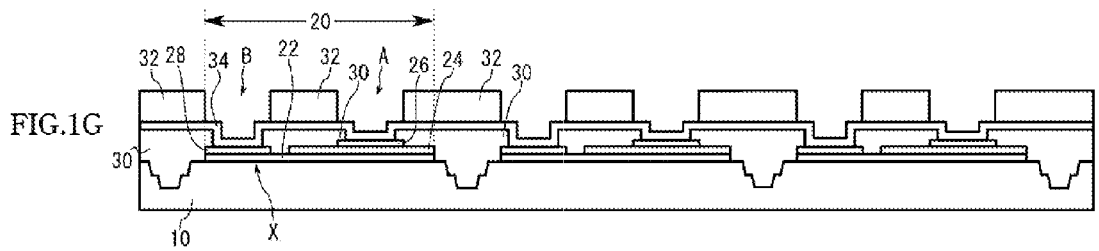

Then, as shown in FIG. 1G, a plating resist 32 is formed. Thereafter, electroplating is performed using the seed metal 34 as a current path. As a result, a p-side wiring layer 36 which is connected to the p-side electrode 26 is formed inside the opening A and on a part of the insulating film 30 around the opening A, and an n-side wiring layer 38 which is connected to the n-side electrode 28 is formed inside the opening B and on a part of the insulating film 30 around the opening B (see FIG. 1H).

Figure 1H:
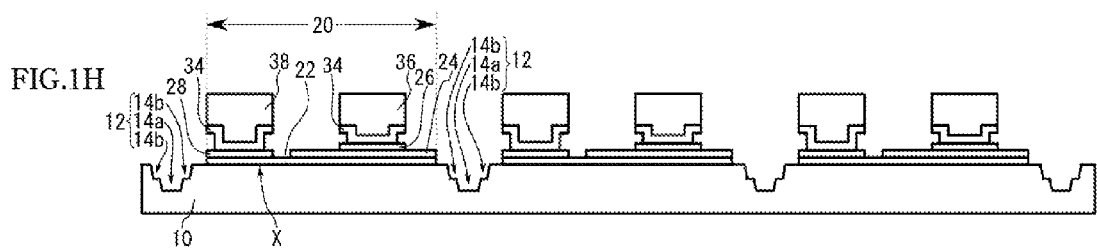

Then, as shown in FIG. 1H, the plating resist 32 and an exposed part of the seed metal 34 are removed to thereby disconnect electrical connection through the seed metal 34 between the p-side wiring layer 36 and the n-side wiring layer 38. Then, the insulating film 30 which covers the surface of the substrate 10 in the region where the first semiconductor layer 22 has been removed and the first recess portion 14a and the second recess portion 14b formed on the substrate 10 is removed. When the insulating film 30 is an extremely-thin inorganic oxidized film and the surface of the substrate 10 in the region where the first semiconductor layer 22 has been removed and the first recess portion 14a and the second recess portion 14b formed on the substrate 10 can therefore be sufficiently filled with the sealing resin 50, it is not necessary to remove the insulating film 30.

When the method includes the step of forming the wiring layers 36, 38 which are electrically connected to the semiconductor light emitting element regions 20 in this manner, the step of forming the first recess portion 14a and the second recess portion 14b on the surface of the substrate 10 is preferably performed prior to the step of forming the wiring layers 36, 38 which are electrically connected to the semiconductor light emitting element regions 20. This is because of that such a configuration makes it possible to perform cleaning of the first recess portion 14a and the second recess portion 14b in the process of forming the wiring layers 36, 38 and prevent contamination and damage of the wiring layers 36, 38 caused by scraps that is generated in the step of forming the first recess portion 14a and the second recess portion 14b on the surface of the substrate 10 and a forming tool for the first recess portion 14a and the second recess portion 14b. The sequential order between the step of forming the first recess portion 14a and the second recess portion 14b and the step of forming the wiring layers 36, 38 may be reversed.

Figure 1I:
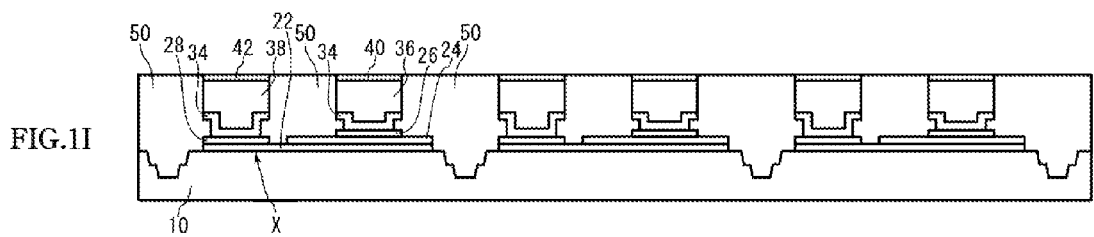

Then, as shown in FIG. 1I, the plurality of semiconductor light emitting element regions 20 are covered with the sealing resin 50 so that the upper surfaces of the p-side wiring layer 36 and the upper surfaces of the n-side wiring layer 38 are exposed. The sealing resin 50 is filled between the p-side wiring layer 36 and the n-side wiring layer 38, and further filled into the surface of the substrate 10 in the region from which the first semiconductor layer 22 has been removed and the first recess portion 14a and the second recess portion 14b formed on the substrate 10. Then, a p-side external terminal layer 40 and an n-side external terminal layer 42 are respectively formed on the exposed surface of the p-side wiring layer 36 and the exposed surface of the n-side wiring layer 38 by electroless-plating nickel and gold in this order. The sealing resin 50 can be formed by application, printing, compression molding, transfer molding, or the like.

(Fourth Step)

Then, the substrate 10 is removed.

Figure 1J:
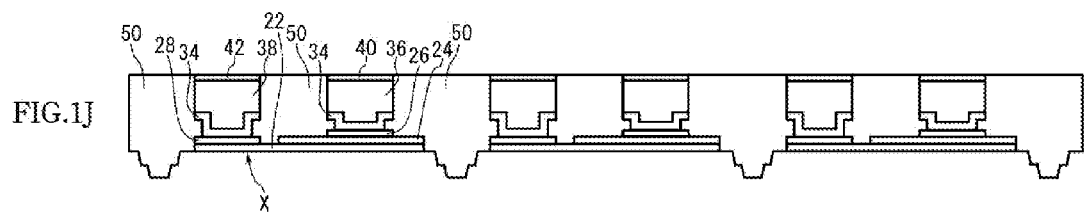

For example, as shown in FIG. 1J, the substrate 10 is first removed by a laser-lift off method. A laser beam is emitted toward the first semiconductor layer 22 from the back surface of the substrate 10, that is, from the side opposite to the first semiconductor layer 22. The laser beam has transmissivity to the substrate 10, but, on the other hand, has a wavelength to be an absorption region to the first semiconductor layer 22. When the laser beam reaches the interface between the substrate 10 and the first semiconductor layer 22, a part of the first semiconductor layer 22 near the interface absorbs the energy of the laser beam so as to be discomposed. For example, when the first semiconductor layer 22 is GaN, the first semiconductor layer 22 is discomposed into Ga and nitrogen gas. The Ga is left on the first semiconductor layer 22. The decomposition reaction forms a minute gap between the substrate 10 and the first semiconductor layer 22 so that the substrate 10 and the first semiconductor layer 22 are separated from each other. Further, the sealing resin 50 which is in contact with the substrate 10 is also separated from the substrate 10 by receiving the energy of the laser beam. Examples of the method for removing the substrate 10 include a method in which a buffer layer disposed on the substrate 10 is etched with a chemical solution such as acid in addition to the laser lift-off method.

(Fifth Step)

Then, the light transmissive resin 60 is disposed on surfaces of the plurality of semiconductor light emitting element regions 20 where the substrate 10 has been removed.

Figure 1K:
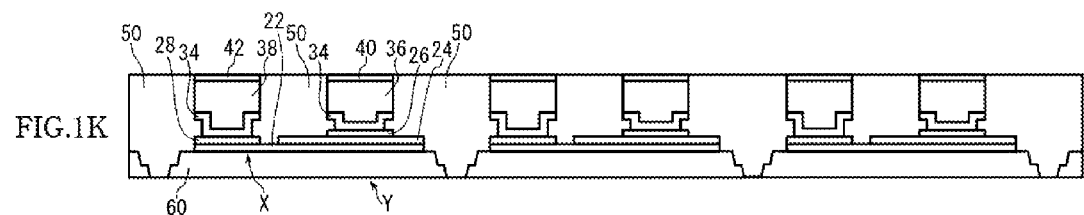

For example, as shown in FIG. 1K, after the removal of the substrate 10, the light transmissive resin 60 is formed on the surface of the first semiconductor layer 22 where the substrate 10 has been removed (the top surfaces X of the semiconductor light emitting element regions 20). It is possible to prevent leakage of light from the side surface of the substrate 10 because the substrate 10 does not exist between the top surface X of the semiconductor light emitting element region 20 and the light transmissive resin 60. Therefore, it is possible to efficiently extract light from the top surface X of the semiconductor light emitting element region 20.

When the light transmissive resin 60 contains a phosphor, it is possible to excite the phosphor by at least a part of light (primary light) emitted from the active layer included in the second semiconductor layer 24 to allow light (secondary light) having a wavelength that differs from the wavelength of the primary light to be emitted from the phosphor, and extract the emitted secondary light from the top surface X of the semiconductor light emitting element region 20. Examples of the phosphor include cerium activated yttrium-aluminum-garnet (YAG), cerium activated lutetium-aluminum-garnet (LAG), europium and/or chrome activated nitrogen-containing calcium aluminosilicate ($CaO$—$Al_2O_3$—$SiO_2$), and europium activated silicate ($(Sr, Ba)_2SiO_4$). When the light transmissive resin 60 contains these phosphors, it is possible to manufacture a semiconductor light emitting device that emits mixed light (for example, white light) of the primary light and the secondary light having a visible wavelength and a semiconductor light emitting device that emits the secondary light having a visible wavelength by being excited by ultraviolet light as the primary light. The phosphor is an example of a wavelength conversion member that converts the wavelength of light.

A phosphor that has a particle diameter of several tens of micrometers can be used. Further, a nanoparticle phosphor that has a particle diameter of 100 nm or less can also be used. By using the nanoparticle phosphor, it is possible to prevent scattering of light and thereby more efficiently extract light from the top surface X of the semiconductor light emitting element region 20.

The light transmissive resin 60 is separated from an adjacent light transmissive resin 60 by the sealing resin 50. Therefore, by allowing the adjacent light transmissive resins 60 to contain a phosphor having a different emission color, it is also possible to manufacture a semiconductor light emitting device that emits light of two or more colors. Further, a top surface Y of the light transmissive resin 60 (the top surface facing the same side as the top surface X of the semiconductor light emitting element region 20) is preferably formed on the same plane as the top surface (of the highest) of the sealing resin 50 for suppression of the peeling. However, the top surface Y may be formed to be lower than the top surface (of the highest) of the sealing resin 50. The light transmissive resin 60 may not be necessarily separated from the adjacent light transmissive resin 60 by the sealing resin 50. That is, the light transmissive resin 60 may be joined to the adjacent light transmissive resin 60 across the sealing resin 50. Also in this case, a part of light emitted toward the lateral side of the light transmissive resin 60 is reflected by the sealing resin 50 toward the top surface Y of the light transmissive resin 60. Therefore, it is possible to efficiently extract light from the top surface Y of the light transmissive resin 60.

(Sixth Step)

Then, the plurality of semiconductor light emitting element regions 20 are divided into individual pieces.

Figure 1L:
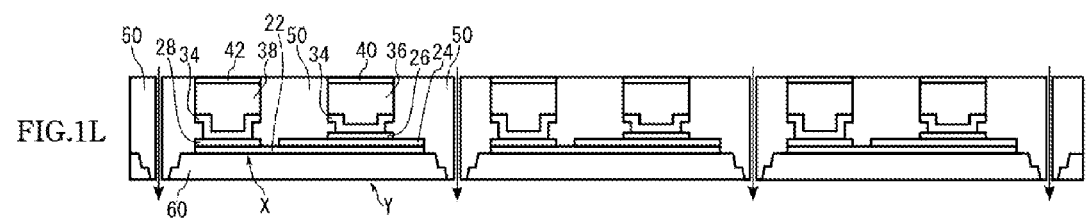
Figure 2A:
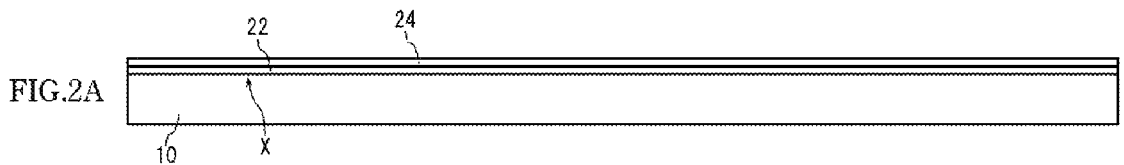
FIGS. 2A to 2L are schematic diagrams showing a method for manufacturing a semiconductor light emitting device according to a second embodiment of the present invention.
Figure 2B:
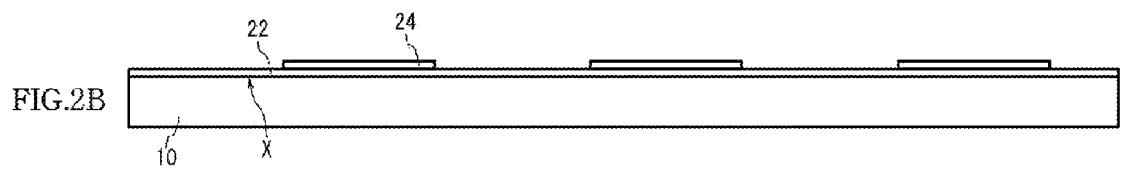
Figure 2C:
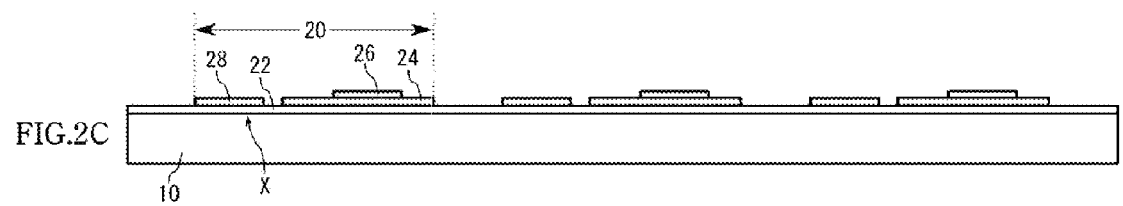
Figure 2D:
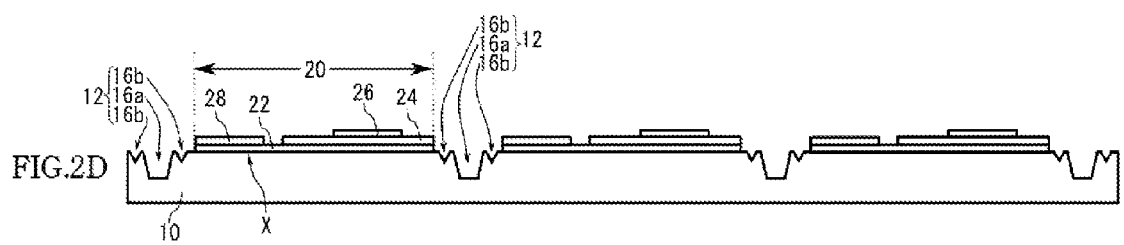
Figure 2E:
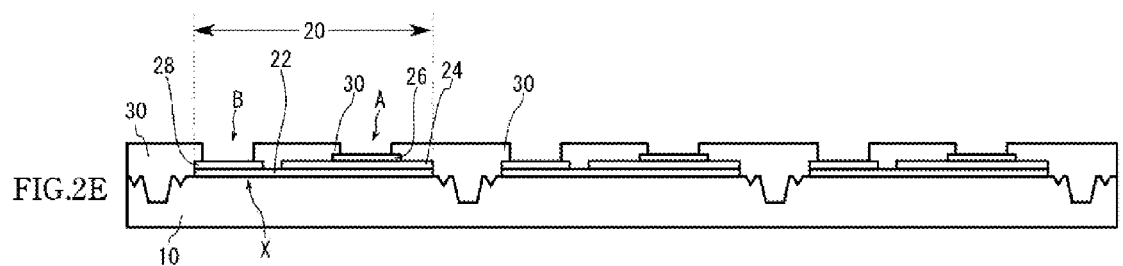
Figure 2F:
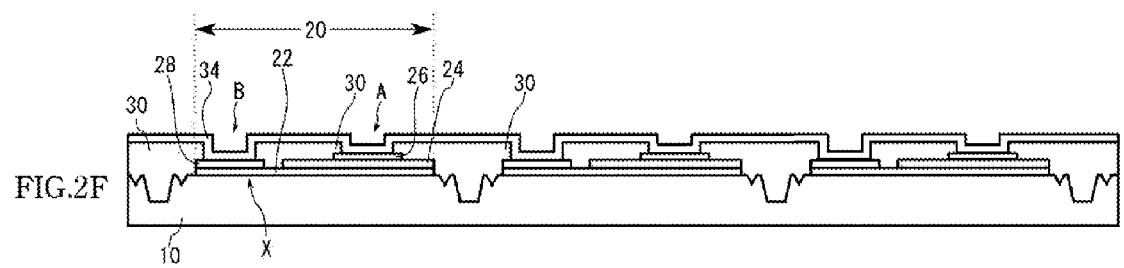
Figure 2G:
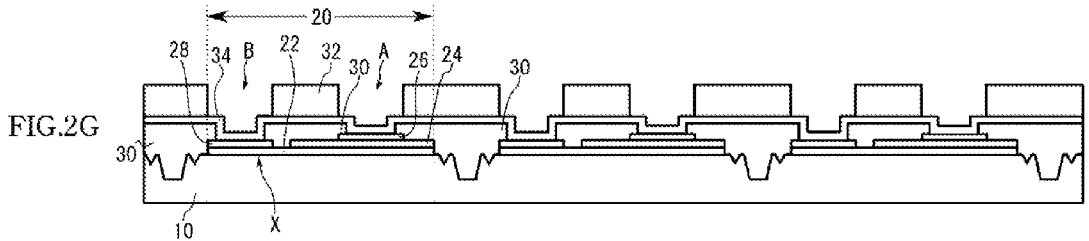
Figure 2H:
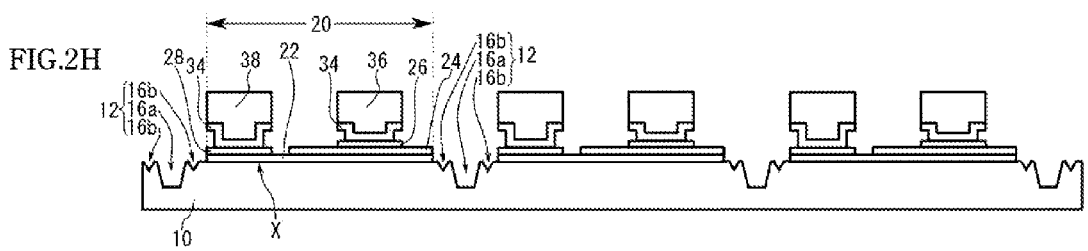
Figure 2I:
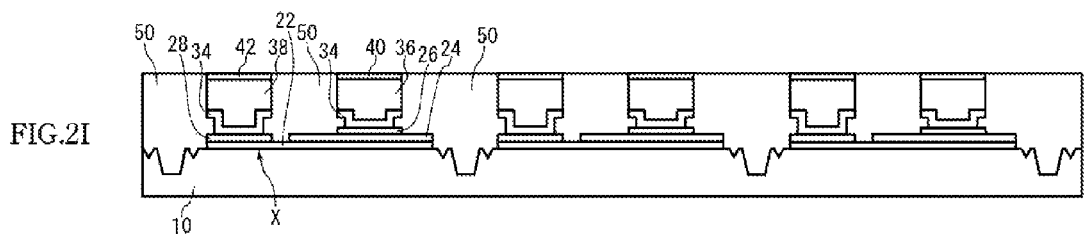
Figure 2J:
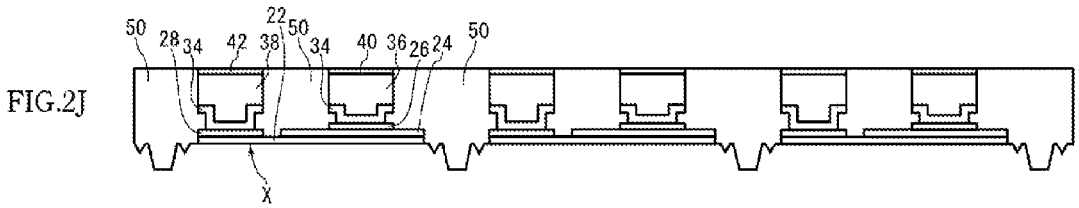
Figure 2K:
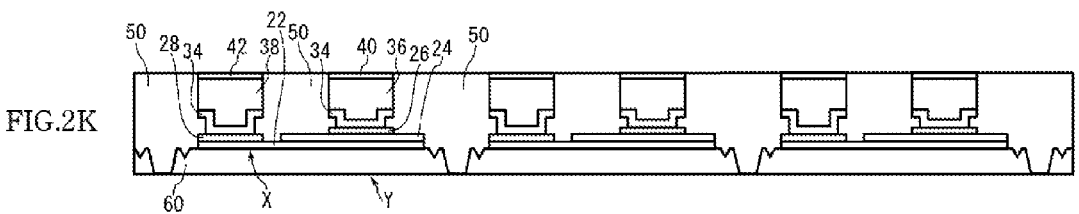
Figure 2L:
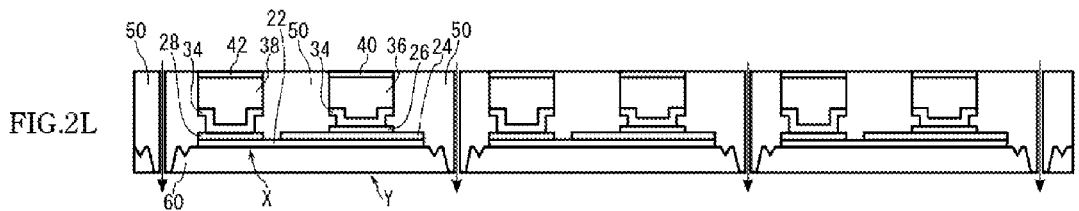

For example, as shown in FIG. 1L, the wafer is diced so that the sealing resin 50 filled in the first recess portion 14a and the second recess portion 14b is left from the center to both ends of the sealing resin 50 to thereby divide the plurality of semiconductor light emitting element regions 20 into individual pieces. The dicing is preferably performed so as to pass the highest step of the sealing resin 50 filled in the first recess portion 14a and the second recess portion 14b (in other words, the deepest portion of the recess portion 12 (14a, 14b); the first recess portion 14a in the first embodiment). Further, the cutting width of the dicing preferably falls within the inner side of the highest step (the first recess portion 14a in the first embodiment) of the sealing resin 50 filled in the first recess portion 14a and the second recess portion 14b. Accordingly, the step difference is left on the side surface of the light transmissive resin 60, and peeling of the light transmissive resin 60 is thereby easily suppressed. As means of the dicing, means such as mechanical cutting using a diamond blade, laser irradiation, and high-pressure water can be used.

The dividing of the plurality of semiconductor light emitting element regions 20 into individual pieces may be performed so that a single semiconductor light emitting device has a single semiconductor light emitting element region 20, or may also be performed so that a single semiconductor light emitting device has a plurality of semiconductor light emitting element regions 20.

In the method for manufacturing the semiconductor light emitting device according to the first embodiment described above, because the sealing resin 50 is left on the side surface of the light transmissive resin 60, it is possible to suppress leakage of light from the side surface of the light transmissive resin 60 which is disposed on the top surface X of the semiconductor light emitting element region 20. Further, such a semiconductor light emitting device can be manufactured in a relatively small number of steps. Further, the method for manufacturing the semiconductor light emitting device according to the first embodiment makes it possible to manufacture the semiconductor light emitting device that is capable of suppressing peeling of the light transmissive resin 60 in a relatively small number of steps.

In the manufacturing method according to the first embodiment, the layers and the electrodes are collectively formed as regions on the wafer. Therefore, it is possible to easily manufacture the semiconductor light emitting device having a small size that is close to a bare chip size.

[Method for Manufacturing Semiconductor Light Emitting Device According to Second Embodiment]

FIGS. 2A to 2L are schematic diagrams showing a method for manufacturing a semiconductor light emitting device according to a second embodiment.

As shown in FIGS. 2A to 2L, the method for manufacturing the semiconductor light emitting device according to the second embodiment differs from the method for manufacturing the semiconductor light emitting device according to the first embodiment in the following point. In the first embodiment, the first recess portion 14a and the second recess portion 14b are formed between the plurality of semiconductor light emitting element regions 20 on the surface of the substrate 10 in the step of forming the recess portion 12 (second step). On the other hand, in the second embodiment, a first recess portion 16a and one or more second recess portions 16b which are shallower than the first recess portion 16a and arranged side by side with the first recess portion 16a (that is, arranged in parallel to the first recess portion 16a) are formed between a plurality of semiconductor light emitting element regions 20 on the surface of a substrate 10 in a step of forming a recess portion 12 (second step). In other words, the first embodiment is an example in which the second recess portion 14b is formed in contact with the first recess portion 14a. On the other hand, the second embodiment is an example in which the second recess portion 16b is formed apart from the first recess portion 16a.

Also in the method for manufacturing the semiconductor light emitting device according to the second embodiment, a sealing resin 50 is left on the side surface of a light transmissive resin 60. Therefore, it is possible to suppress leakage of light from the side surface of the light transmissive resin 60 which is disposed on the top surface X of the semiconductor light emitting element region 20. Further, such a semiconductor light emitting device can be manufactured in a relatively small number of steps. Further, it is possible to manufacture the semiconductor light emitting device that is capable of suppressing peeling of the light transmissive resin 60 in a relatively small number of steps. Further, because layers and electrodes are collectively formed as regions on the wafer, it is possible to easily manufacture the semiconductor light emitting device having a small size that is close to a bare chip size. Further, the method for manufacturing the semiconductor light emitting device according to the second embodiment makes it possible to suppress the sealing resin 50 filled in the recess portion 12 from peeling off together with the substrate 10.

It is sufficient to form a single second recess portion 16b on one side of the first recess portion 16a. However, it is preferred to form at least one second recess portion 16b on each side of the first recess portion 16a. Such a configuration makes it possible to form at least one second recess portion 16b on each side of the semiconductor light emitting element region 20. The second recess portion 16b can be formed into various shapes in plan view (for example, a linear shape, a broken line shape, and a dotted shape).

The first recess portion 14a and the second recess portion 14b formed in the first embodiment and the first recess portion 16a and the second recess portion 16b formed in the second embodiment are all examples of the recess portion in the present invention.

FIRST EXAMPLE

Figure 3A:
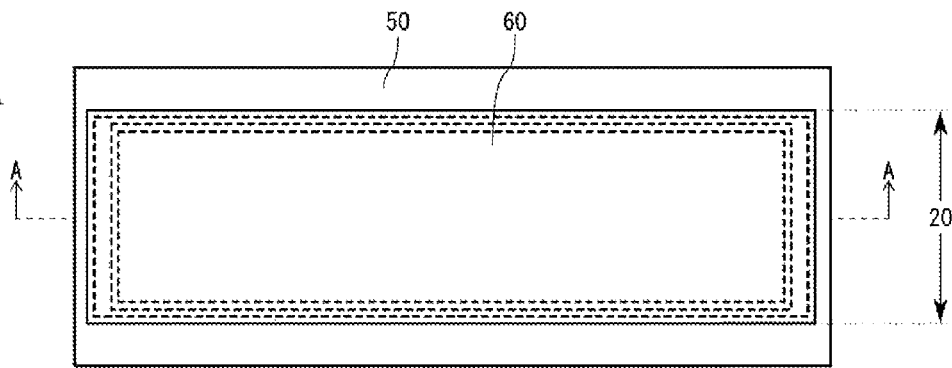
Figure 3B:
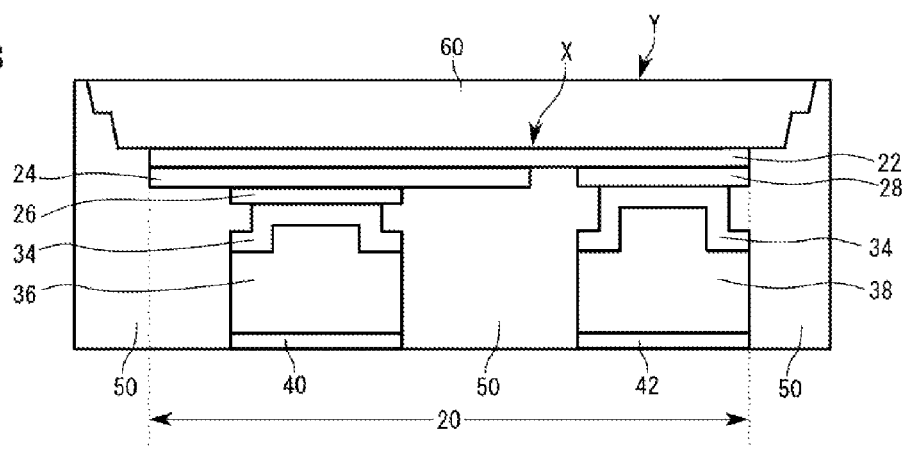
Figure 3C:
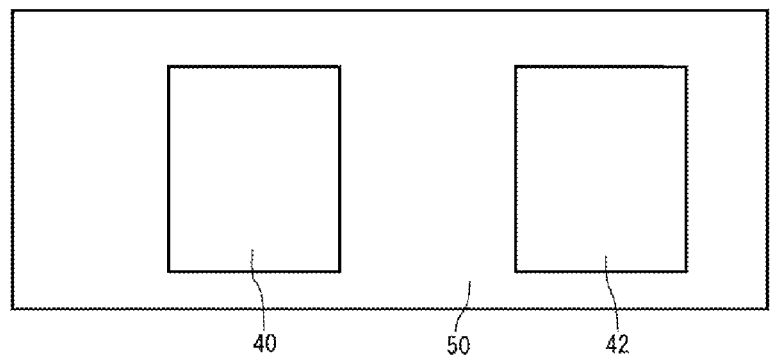

FIGS. 3A to 3C are schematic diagrams of a semiconductor light emitting device according to a first example, wherein FIG. 3A is a schematic top view; FIG. 3B is a schematic cross-sectional view taken along line A-A of FIG. 3A; and FIG. 3C is a schematic bottom view. For the purpose of easy understanding, in FIG. 3A, a part of a linear wall of a sealing resin 50, the part being covered with a light transmissive resin 60, is indicated by a broken line.

The semiconductor light emitting device according to the first example is an example of the semiconductor light emitting device that can be manufactured by the method for manufacturing the semiconductor light emitting device according to the first embodiment. As shown in FIGS. 3A to 3C, the semiconductor light emitting device according to the first example includes a semiconductor light emitting element region 20, a light transmissive resin 60 which is disposed on a top surface X of the semiconductor light emitting element region 20 and contains a phosphor, a light reflective sealing resin 50 which covers the semiconductor light emitting element region 20 and the light transmissive resin 60 so that a top surface Y (the surface facing the same side as the top surface X of the semiconductor light emitting element region 20) of the light transmissive resin 60 is exposed. The semiconductor light emitting device according to the first example is obtained by dividing a wafer into individual pieces. Layers and electrodes are collectively formed as regions on the wafer.

Hereinafter, the above components will be sequentially described.

[Semiconductor Light Emitting Element Region 20]

The semiconductor light emitting element region 20 includes a first semiconductor layer 22, a second semiconductor layer 24, a p-side electrode 26, an n-side electrode 28, a p-side wiring layer 36, an n-side wiring layer 38, a p-side external terminal layer 40, and an n-side external terminal layer 42.

(First Semiconductor Layer 22)

For example, a nitride semiconductor is used as the first semiconductor layer 22. The polarity of the first semiconductor layer 22 may be n-type, or may also be p-type. The first semiconductor layer 22 functions as a transverse current path. Light emitted from an active layer included in the second semiconductor layer 24 is extracted from the top surface X of the semiconductor light emitting element region 20.

(Second Semiconductor Layer 24)

For example, a nitride semiconductor is used as the second semiconductor layer 24. For example, the second semiconductor layer 24 includes an n-type clad layer, the active layer, and a p-type clad layer in this order from the side facing the first semiconductor layer 22. The second semiconductor layer 24 is formed in a partial area of the first semiconductor layer 22. Therefore, the plane size of the second semiconductor layer 24 is smaller than the plane size of the first semiconductor layer 22.

(P-Side Electrode 26, N-Side Electrode 28)

The p-side electrode 26 is disposed on the surface of the second semiconductor layer 24, the surface being located opposite to the first semiconductor layer 22. The n-side electrode 28 is disposed in a part of the first semiconductor layer 22 where the second semiconductor layer 24 is not disposed. Further, an insulating film such as a silicon oxide film may be interposed between the end of the p-side electrode 26 and the end of the n-side electrode 28.

(P-Side Wiring Layer 36, N-Side Wiring Layer 38)

The p-side wiring layer 36 and the n-side wiring layer 38 are formed by an electroplating method that uses, as a current path, a seed metal 34 which is disposed on the surface of the sealing resin 50 and inner walls of openings A, B formed on the sealing resin 50. The p-side wiring layer 36 and the n-side wiring layer 38 are respectively connected to the p-side electrode 26 and the n-side electrode 28. The p-side wiring layer 36 and the n-side wiring layer 38 may be respectively connected to the p-side electrode 26 and the n-side electrode 28 through metal bumps (Au bumps, for example) which are disposed on the p-side electrode 26 and the n-side electrode 28.

(P-Side External Terminal Layer 40, N-Side External Terminal Layer 42)

The p-side external terminal layer 40 and the n-side external terminal layer 42 are respectively formed on the p-side wiring layer 36 and the n-side wiring layer 38 by an electroless plating method. Copper, gold, silver, and nickel can be used in the p-side wiring layer 36 and the n-side wiring layer 38. Among these materials, copper is preferred in terms of its excellent thermal conductivity, high migration resistance, adhesion with the sealing resin 50, and cost. On the other hand, gold plating with nickel base is preferred in terms of solderability to an external circuit board.

(Light Transmissive Resin 60)

The light transmissive resin 60 is disposed on the top surface X of the semiconductor light emitting element region 20 and contains a phosphor. The phosphor is excited by light from the active layer included in the second semiconductor layer 24 and emits light having a wavelength that differs from the wavelength of the light from the active layer. Therefore, mixed light of light from the active layer and light from the phosphor is extracted from the semiconductor light emitting device. For example, when a nitride semiconductor is used as the active layer and a yellow phosphor is used as the phosphor, a mixed color (that is, a white color or a bulb color) of blue light from the active layer and yellow light from the yellow phosphor is extracted from the semiconductor light emitting device.

(Sealing Resin 50)

The sealing resin 50 has light reflectivity and covers the semiconductor light emitting element region 20 and the light transmissive resin 60 so that the top surface Y of the light transmissive resin 60 is exposed. In plan view, the semiconductor light emitting element region 20 and the light transmissive resin 60 are surrounded by a linear wall of the sealing resin 50. A step difference is formed on the linear wall of the sealing resin 50.

An insulating member is used as the sealing resin 50. For example, a silicone resin containing titanium oxide can be used as the sealing resin 50. This makes it possible to relax the stress applied to the semiconductor light emitting element region 20 by the sealing resin 50 when the semiconductor light emitting device is mounted on an external circuit board or the like. Therefore, even when the thickness of the semiconductor light emitting element region 20 is thin, the mechanical strength of the semiconductor light emitting device can be improved. The mechanical strength can be further improved by increasing the thickness of the sealing resin 50, the n-side wiring layer 38, and/or the p-side wiring layer 36.

In the above semiconductor light emitting device according to the first example, the semiconductor light emitting element region 20 and the light transmissive resin 60 are surrounded by the sealing resin 50. Therefore, it is possible to suppress leakage of light from the side surfaces of the semiconductor light emitting element region 20 and the light transmissive resin 60 to thereby efficiently extract light from the top surface Y (the surface facing the same side as the top surface X of the semiconductor light emitting element region 20) of the light transmissive resin 60. Further, because not only leakage of light from the side surface of the semiconductor light emitting element region 20, but also leakage of light from the side surface of the light transmissive resin 60 is suppressed, it is also possible to improve the uniformity of luminescent color of the semiconductor light emitting device. Further, it is possible to suppress peeling of the light transmissive resin 60.

SECOND EXAMPLE

Figure 4A:
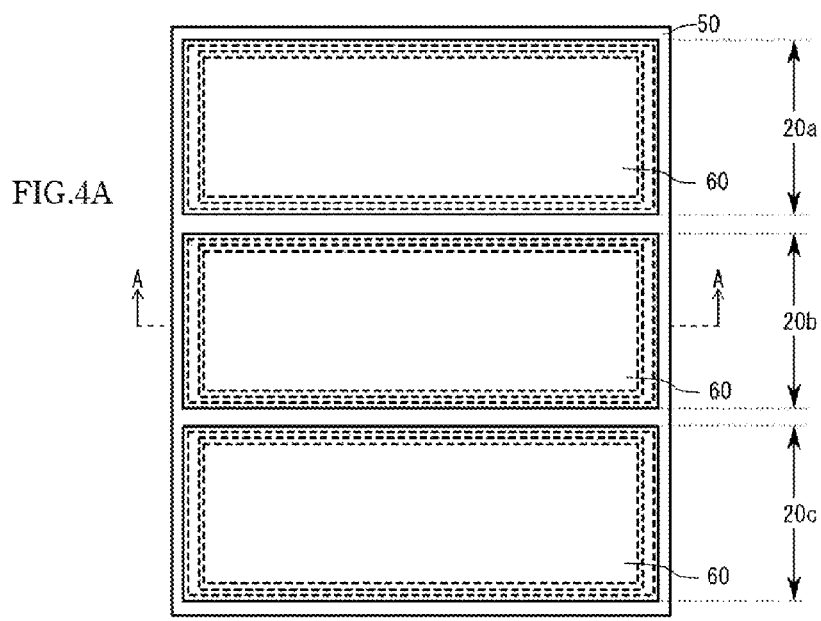
Figure 4B:
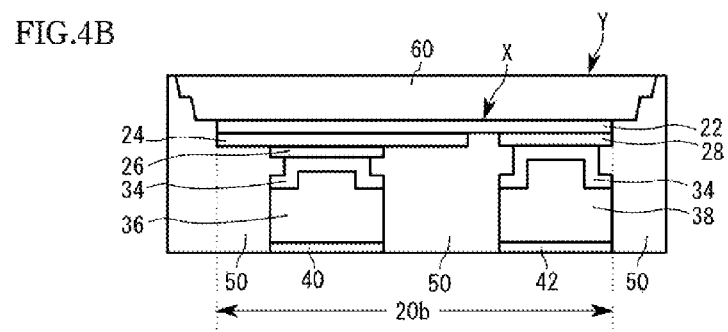
Figure 4C:
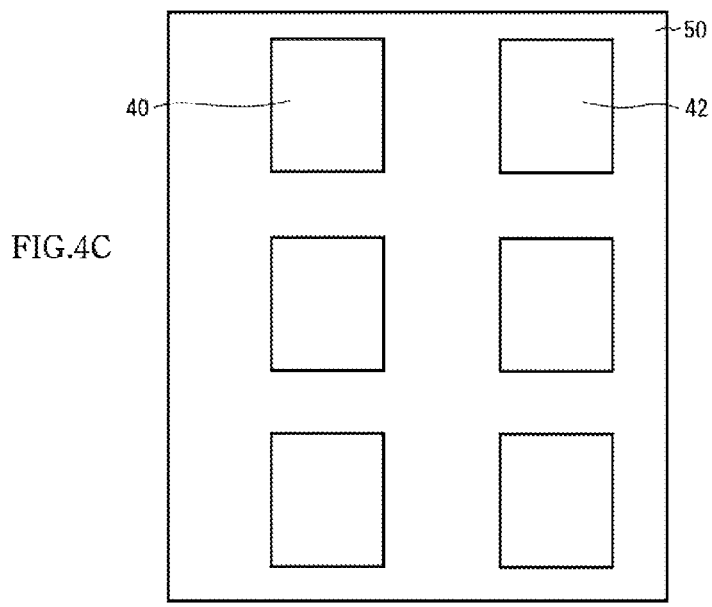

FIGS. 4A to 4C are schematic diagrams of a semiconductor light emitting device according to a second example. FIG. 4A is a schematic top view. FIG. 4B is a schematic cross-sectional view taken along line A-A of FIG. 4A. FIG. 4C is a schematic bottom view. For the purpose of easy understanding, in FIG. 4A, a part of a linear wall of a sealing resin 50, the part being covered with a light transmissive resin 60, is indicated by a broken line.

The semiconductor light emitting device according to the second example is an example of the semiconductor light emitting device that can be manufactured by the method for manufacturing the semiconductor light emitting device according to the first embodiment. The semiconductor light emitting device according to the second example differs from the semiconductor light emitting device according to the first example in the following point. In the first example, a single semiconductor light emitting device includes a single semiconductor light emitting element region 20. On the other hand, as shown in FIGS. 4A to 4C, a single semiconductor light emitting device includes three semiconductor light emitting element regions 20a, 20b, 20c in the second example. The semiconductor light emitting device according to the second example can be used as a small and thin semiconductor light emitting device that can emit light of red, green, and blue.

As an example, the semiconductor light emitting device according to the second example can be configured to include a red light emitting element region, a green light emitting element region, and a blue light emitting element region, wherein the red light emitting element region includes a semiconductor light emitting element region 20a that emits blue light and a light transmissive resin 60 that contains a phosphor that is excited by blue light and thereby emits red light, the green light emitting element region includes a semiconductor light emitting element region 20b that emits blue light and a light transmissive resin 60 that contains a phosphor that is excited by blue light and thereby emits green light, and the blue light emitting element region includes a semiconductor light emitting element region 20c that emits blue light and a light transmissive resin 60 that does not contain a phosphor or contains dispersant.

Further, as another example, the semiconductor light emitting device according to the second example can be configured to include a red light emitting element region, a green light emitting element region, and a blue light emitting element region, wherein the red light emitting element region includes a semiconductor light emitting element region 20a that emits ultraviolet light (UV light) and a light transmissive resin 60 that contains a phosphor that is excited by ultraviolet light (UV light) and thereby emits red light, the green light emitting element region includes a semiconductor light emitting element region 20b that emits ultraviolet light (UV light) and a light transmissive resin 60 that contains a phosphor that is excited by ultraviolet light (UV light) and thereby emits green light, and the blue light emitting element region includes a semiconductor light emitting element region 20c that emits ultraviolet light (UV light) and a transmissive resin 60 that contains a phosphor which is excited by ultraviolet light (UV light) and thereby emits blue light.

The red light emitting element region, the green light emitting element region, and the blue light emitting element region are separated from one another by the sealing resin 50. A p-side external terminal layer 40 and an n-side external terminal layer 42 are provided in each of the red light emitting element region, the green light emitting element region, and the blue light emitting element region.

THIRD EXAMPLE

Figure 5A:
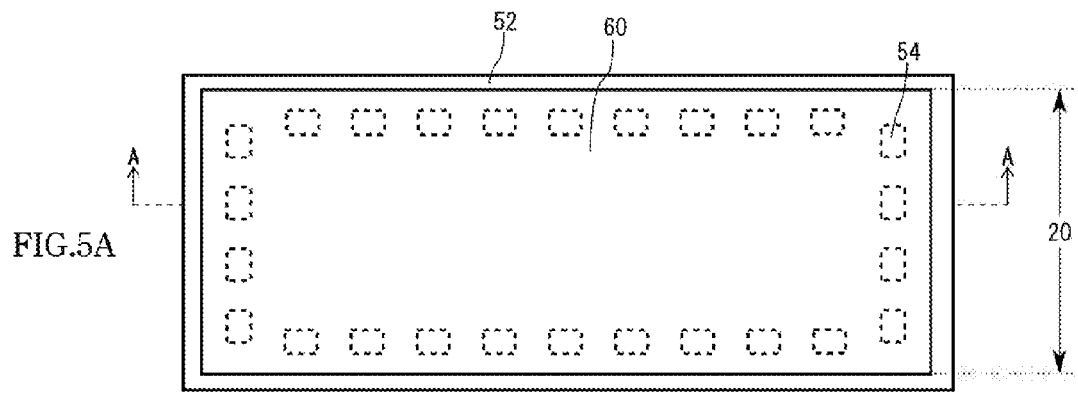
Figure 5B:
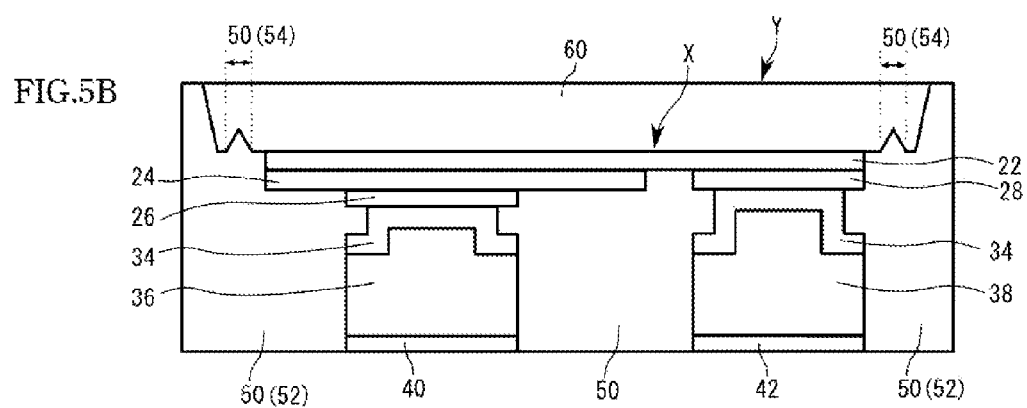
Figure 5C:
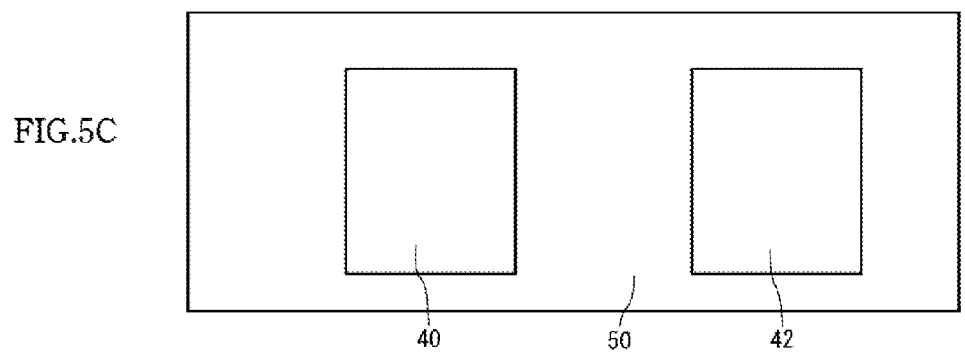

FIGS. 5A to 5C are schematic diagrams of a semiconductor light emitting device according to a third example. FIG. 5A is a schematic top view. FIG. 5B is a schematic cross-sectional view taken along line A-A of FIG. 5A. FIG. 5C is a schematic bottom view. For the purpose of easy understanding, in FIG. 5A, a second wall 54 which is covered with a light transmissive resin 60 is indicated by a broken line.

The semiconductor light emitting device according to the third example is an example of the semiconductor light emitting device that can be manufactured by the method for manufacturing the semiconductor light emitting device according to the second embodiment. As shown in FIGS. 5A to 5C, the semiconductor light emitting device according to the third example differs from the semiconductor light emitting device according to the first example in that a semiconductor light emitting element region 20 and a light transmissive resin 60 are surrounded by a first wall 52 and the second wall 54 of a sealing resin 50 in plan view. The first wall 52 is located on the outer side of the second wall 54 and higher than the second wall 54. The second wall 54 is formed into a broken line shape in plan view. However, the second wall 54 can be formed into various shapes (a linear shape and a dotted shape, for example) other than the broken line shape. The semiconductor light emitting device according to the third example can also achieve the same effect achieved by the semiconductor light emitting device according to the first example.

Hereinabove, the embodiments and the examples have been described. However, the above description relates to an example of the present invention, and the present invention is not limited at all by the description.

REFERENCE MARKS IN THE DRAWINGS

10 substrate
12 recess portion
14a first recess portion
14b second recess portion
16a first recess portion
16b second recess portion
20 semiconductor light emitting element region
22 first semiconductor layer
24 second semiconductor layer
26 p-side electrode
28 n-side electrode
30 insulating film
32 plating resist
34 seed metal
36 p-side wiring layer
8 n-side wiring layer
40 p-side external terminal layer
42 n-side external terminal layer
50 sealing resin
52 first wall
54 second wall
60 light transmissive resin
X top surface of semiconductor light emitting element region
Y top surface of light transmissive resin

What is claimed is:

1. A method for manufacturing a semiconductor light emitting device comprising steps of:
    forming a plurality of semiconductor light emitting element regions on a substrate;
    forming a recess portion between the plurality of semiconductor light emitting element regions in a surface of the substrate, wherein the recess portion includes a first recess portion and one or more second recess portions shallower than the first recess portion;
    disposing a light reflective sealing resin so as to cover portions of the plurality of semiconductor light emitting element regions and to fill the recess portion;
    removing the substrate;
    disposing a light transmissive resin on surfaces of the plurality of semiconductor light emitting element regions where the substrate has been removed; and
    dividing the plurality of semiconductor light emitting element regions into individual pieces.

2. The method for manufacturing the semiconductor light emitting device according to claim 1, wherein the one or more second recess portions are formed apart from the first recess portion.

3. The method for manufacturing the semiconductor light emitting device according to claim 1, wherein the one or more second recess portions are formed in contact with the first recess portion.

4. The method for manufacturing the semiconductor light emitting device according to claim 1, wherein the recess portion has a shape tapered from an opening toward a bottom.

5. The method for manufacturing the semiconductor light emitting device according to claim 1, further comprising:
    a step of forming a wiring layer electrically connected to the semiconductor light emitting element regions prior to the step of disposing the sealing resin,
    wherein the step of forming the recess portion in the surface of the substrate is performed prior to the step of forming the wiring layer.

6. The method for manufacturing the semiconductor light emitting device according to claim 1, wherein the substrate is removed by laser lift-off.

7. The method for manufacturing the semiconductor light emitting device according to claim 1, wherein the step of dividing the plurality of semiconductor light emitting element regions into individual pieces is performed so that a single semiconductor light emitting device has a plurality of semiconductor light emitting element regions.

8. The method for manufacturing the semiconductor light emitting device according to claim 1, wherein the substrate is removed by etching a buffer layer disposed on the substrate with a chemical solution.

9. The method for manufacturing the semiconductor light emitting device according to claim 2, wherein the recess portion has a shape tapered from an opening toward a bottom.

10. The method for manufacturing the semiconductor light emitting device according to claim 2, wherein the substrate is removed by laser lift-off.

11. The method for manufacturing the semiconductor light emitting device according to claim 9, wherein the substrate is removed by laser lift-off.

12. The method for manufacturing the semiconductor light emitting device according to claim 2, wherein the substrate is removed by etching a buffer layer disposed on the substrate with a chemical solution.

13. The method for manufacturing the semiconductor light emitting device according to claim 2, wherein the step of dividing the plurality of semiconductor light emitting element regions into individual pieces is performed so that a single semiconductor light emitting device has a plurality of semiconductor light emitting element regions.

14. The method for manufacturing the semiconductor light emitting device according to claim 2, further comprising:
   a step of forming a wiring layer electrically connected to the semiconductor light emitting element regions prior to the step of disposing the sealing resin,
   wherein the step of forming the recess portion on the surface of the substrate is performed prior to the step of forming the wiring layer.

15. The method for manufacturing the semiconductor light emitting device according to claim 3, wherein the recess portion has a shape tapered from an opening toward a bottom.

16. The method for manufacturing the semiconductor light emitting device according to claim 3, wherein the substrate is removed by laser lift-off.

17. The method for manufacturing the semiconductor light emitting device according to claim 15, wherein the substrate is removed by laser lift-off.

18. The method for manufacturing the semiconductor light emitting device according to claim 3, wherein the substrate is removed by etching a buffer layer disposed on the substrate with a chemical solution.

19. The method for manufacturing the semiconductor light emitting device according to claim 3, wherein the step of dividing the plurality of semiconductor light emitting element regions into individual pieces is performed so that a single semiconductor light emitting device has a plurality of semiconductor light emitting element regions.

20. The method for manufacturing the semiconductor light emitting device according to claim 3, further comprising:
   a step of forming a wiring layer electrically connected to the semiconductor light emitting element regions prior to the step of disposing the sealing resin,
   wherein the step of forming the recess portion in the surface of the substrate is performed prior to the step of forming the wiring layer.

* * * * *